United States Patent
Hagihara

(10) Patent No.: US 8,310,390 B2
(45) Date of Patent: Nov. 13, 2012

(54) A/D CONVERSION CIRCUIT AND SOLID STATE IMAGING DEVICE

(75) Inventor: Yoshio Hagihara, Tokyo (JP)

(73) Assignees: Olympus Corporation, Tokyo (JP); Denso Corporation, Kariya-shi (JP)

( * ) Notice: Subject to any disclaimer, the term of this patent is extended or adjusted under 35 U.S.C. 154(b) by 176 days.

(21) Appl. No.: 12/994,604

(22) PCT Filed: May 22, 2009

(86) PCT No.: PCT/JP2009/059428
§ 371 (c)(1),
(2), (4) Date: Nov. 24, 2010

(87) PCT Pub. No.: WO2009/145119
PCT Pub. Date: Dec. 3, 2009

(65) Prior Publication Data
US 2011/0095928 A1    Apr. 28, 2011

(30) Foreign Application Priority Data
May 26, 2008  (JP) ................................ 2008-136355

(51) Int. Cl.
*H03M 1/50*  (2006.01)
(52) U.S. Cl. ......... 341/166; 250/208.1; 363/71; 363/41; 363/132; 377/42; 345/76; 345/81
(58) Field of Classification Search .......... 341/155–170; 250/208.1; 363/71, 41, 132; 377/42; 345/76, 345/81
See application file for complete search history.

(56) References Cited

U.S. PATENT DOCUMENTS
5,396,247 A * 3/1995 Watanabe et al. ............. 341/157
(Continued)

FOREIGN PATENT DOCUMENTS
JP    5-259907 A    10/1993
(Continued)

OTHER PUBLICATIONS

Watanabe, Takamoto et al "An All-Digital Analog-to-Digital Converter With 12-μV/LSB Using Moving-Average Filtering," IEEE Journal of Solid-State Circuits, vol. 38, No. 1, Jan. 2003, pp. 120-125.

(Continued)

*Primary Examiner* — Lam T Mai
(74) *Attorney, Agent, or Firm* — Westerman, Hattori, Daniels & Adrian, LLP

(57) ABSTRACT

A clock generating circuit in which a plurality of stages of inverting circuits are connected, a start signal that causes start of clock generation and an output signal from the inverting circuit of a predetermined stage are input to one of the inverting circuits, an element having impedance that changes in accordance with a magnitude of an object analog signal that is an object of conversion to a digital signal is provided between the adjacent inverting circuits, generates a clock of a frequency in accordance with the magnitude of the object analog signal. A counter counts the number of clocks generated by the clock generating circuit and outputs a count value.

10 Claims, 9 Drawing Sheets

U.S. PATENT DOCUMENTS

| | | | |
|---|---|---|---|
| 6,504,439 B1 | 1/2003 | Ozawa et al. | |
| 6,715,096 B2* | 3/2004 | Kuge | 713/600 |
| 7,071,910 B1* | 7/2006 | Takemura | 345/90 |
| 7,268,719 B2* | 9/2007 | Terazawa et al. | 341/157 |
| 8,139,385 B2* | 3/2012 | Furuchi | 363/132 |
| 2006/0244649 A1* | 11/2006 | Terazawa et al. | 341/155 |
| 2006/0262055 A1* | 11/2006 | Takahara | 345/81 |
| 2007/0080905 A1* | 4/2007 | Takahara | 345/76 |
| 2011/0221409 A1* | 9/2011 | Nakamura et al. | 323/272 |
| 2011/0292260 A1* | 12/2011 | Hagihara | 348/294 |

FOREIGN PATENT DOCUMENTS

| | | |
|---|---|---|
| JP | 11-027107 A | 1/1999 |
| JP | 2007-134786 A | 5/2007 |
| WO | 2007/072551 A1 | 6/2007 |

OTHER PUBLICATIONS

International Search Report of PCT/JP2009/059428, mailing date Jun. 16, 2009.

* cited by examiner

A/D CONVERSION CIRCUIT AND SOLID STATE IMAGING DEVICE

TECHNICAL FIELD

The present invention relates to an A/D conversion circuit that converts an analog signal to a digital signal, and to a solid state imaging device that is provided with the A/D conversion circuit.

Priority is claimed on Japanese Patent Application No. 2008-136355, filed May 26, 2008, the content of which is incorporated herein by reference.

BACKGROUND ART

Conventionally, the constitution shown in FIG. 8 is known as an example of an A/D (analog/digital) conversion circuit (for example, refer to Non-patent Document 1). FIG. 8 is a diagram showing the configuration of the conventionally known A/D conversion circuit.

In the example shown, the A/D conversion circuit 190 includes a clock generating circuit 191 that couples in a ring shape one negative AND (NAND) circuit 1911 as an inverting circuit for activation that operates upon receiving a pulse signal StartP to one input terminal, and a plurality of inverter (INV) circuits 1912 as inverting circuits; a counter 192 and an encoder 193 that measure the output signal from the clock generating circuit 191; a latch circuit 194 that holds the output signal from the counter 192; a latch circuit 195 that holds the output signal from the encoder 193; a latch circuit 196 that adds the output signals from the latch circuit 194 and the latch circuit 195 and holds the sum; and a computing unit 197 that computes the difference between the previous signal and the current signal using the latch circuit 196, and outputs it to an external subsequent stage circuit.

Also, in the illustrated example, the NAND circuit 1911 and the inverter circuits 1912 in the clock generating circuit 191, and a power source line 1913 for supplying power to the inverter circuits 1912 are connected to an input terminal 198 of the analog input signal Vin that is the object of the A/D conversion via a buffer circuit 199. Also, clock (CLK) signal CKs is input to the encoder 193 and the latch circuits 194 and 195.

Next, the operation of the A/D conversion circuit 190 shall be described. As shown in FIG. 8, the clock generating circuit 191 causes the pulse signal StartP to go around the circuit consisting of the single NAND circuit 1911 and the plurality of inverter circuits 1912 that are configured in a ring shape.

The counter 192 counts the number of times that the pulse signal StartP, which changes in accordance with the analog input signal Vin and the cycle of the clock (CLK) signal CKs, goes around the circuit in the clock generating circuit 191, and outputs it as binary digital data. The encoder 193 detects the position of the pulse signal StartP, which changes in accordance with the analog input signal Vin and the cycle of the clock (CLK) signal CKs, in the loop of the circuit in the clock generating circuit 191, and outputs it as binary digital data.

The latch circuit 194 holds the digital data that counter 192 outputs. The latch circuit 195 holds the digital data that the encoder 193 outputs. The latch circuit 196 makes the digital data that the latch circuit 194 holds the high-order bits, and the digital data that the latch circuit 195 holds the low-order bits and takes them in, and by adding together these digital data, generates and holds binary digital data according to the analog input signal Vin in the cycle of the clock signal CKs.

The computing unit 197 computes the difference between the digital data that the latch circuit 196 held with the previous digital data that the latch circuit 196 held, and outputs the computed digital data DT to an external subsequent stage circuit.

FIG. 9 is a diagram that shows the relation between the magnitude of the analog input signal Vin in the A/D conversion circuit 190, and the propagation delay time of the pulse signal StartP that travels in the circuit. In the A/D conversion circuit 190, in the case of the analog input signal Vin being low, the propagation delay time of the pulse signal StartP increases, and in the case of the analog input signal Vin being high, the propagation delay time of the pulse signal StartP decreases. Accordingly, digital data according to the propagation delay time of this pulse signal StartP is output from the A/D conversion circuit 190.

FIG. 10 is a diagram that shows the relation of the sampling cycle in the A/D conversion circuit 190 and the timing of outputting digital data. The A/D conversion circuit 190 cyclically outputs the digital data DT in accordance with the cycle of the clock signal CKs that is the sampling cycle. In the example that is illustrated, it outputs the digital data 2121 at the sampling cycle 2111, outputs the digital data 2122 at the sampling cycle 2112, and outputs the digital data 2123 at the sampling cycle 2113.

As stated above, the A/D conversion circuit 190 cyclically outputs the digital data DT corresponding to the analog input signal Vin in accordance with the cycle of the clock signal CKs.

Also, as a clock generating circuit that is included in an A/D conversion circuit, there is known a constitution that provides a delay element between inverting circuits that constitute the clock generating circuit (for example, refer to Patent Document 1). According to this constitution, compared to the case of there being no delay element, by delaying the propagation speed of the clock signal of the clock generating circuit, a reduction in malfunctioning becomes possible by hindering the effects of wiring resistance, wiring capacity and parasitic elements.

PRIOR ART DOCUMENTS

Patent Document

[Patent Document 1] Japanese Unexamined Patent Application, First Publication No. 2007-134786

Non-Patent Document

[Non-patent Document 1]
IEEE Journal of Solid-State Circuits, Vol. 38, No. 1 January 2003, "An All-Digital Analog-to-digital Converter with 12-µV/LSB Using Moving-Average Filtering"

SUMMARY OF THE INVENTION

Problem to be Solved by the Invention

However, the clock generating circuit that is included in the A/D conversion circuit disclosed in Patent Document 1 and Non-patent Document 1 requires a buffer circuit that supplies electrical power in accordance with the analog input signal Vin that is the object of the A/D conversion. For that reason, there were problems in that in the A/D conversion circuit (clock generating circuit), the circuitry becomes complex, the area of the circuit increases, and the power consumption also increases.

The present invention has been achieved in view of the above circumstances, and has as its object to provide an A/D conversion circuit and a solid state imaging device that can constitute a clock generating circuit without providing a buffer circuit for supplying electrical power.

Means for Solving the Problem

The present invention provides an A/D conversion circuit including: a clock generating circuit in which a plurality of stages of inverting circuits are connected, a start signal that causes start of clock generation and an output signal from the inverting circuit of a predetermined stage are input to one of the inverting circuits, an element having impedance that changes in accordance with a magnitude of an object analog signal that is an object of conversion to a digital signal is provided between the adjacent inverting circuits, and which generates a clock of a frequency in accordance with the magnitude of the object analog signal; and a counting section that counts the number of clocks generated by the clock generating circuit and outputs a count value.

Thereby, with a simple circuit, the area of the circuit can be reduced, and the power consumption can be reduced. Also, it is possible to constitute an A/D conversion circuit without providing a buffer circuit for supplying electrical power. Also, since there is no longer a need to supply electrical power in accordance with the analog signal that is the object of A/D conversion as the power supply of the clock generating circuit, it is possible to make common with another (constant) power supply.

In the A/D conversion circuit of the present invention, the element is for example a resistive element. Also, in the A/D conversion circuit of the present invention, the element is for example a capacitative element.

Also, in the A/D conversion circuit of the present invention, the resistive element is, for example, a MOS transistor that has three terminals, the first terminal being connected to an output terminal of the inverting circuit of a previous stage, the second terminal being connected to the inverting circuit of a subsequent stage, and the target analog signal being supplied to a control terminal that controls current that flows between the first terminal and the second terminal.

Thereby, it is possible to realize a resistive element with a simple constitution.

Also, the A/D conversion circuit according to the present invention may further include: a data generating section that generates data based on an output signal that each of the plurality of inverting circuits that are included in the clock generating circuit outputs; and a digital data generating section that generates digital data in accordance with the magnitude of the object analog signal, based on the data that is generated by the data generating section and the count value that is output by the counting section.

Thereby, since it is possible to use the output from the inverting circuits that constitute the clock generating circuit for data generation of low-order bits of A/D conversion, the resolution performance of the A/D conversion improves.

Also, the present invention provides a solid state imaging device including: an imaging section in which are arranged in a matrix a plurality of pixels that output a pixel signal in accordance with a magnitude of an incident electromagnetic wave; and an A/D conversion circuit that converts the pixel signal that is output by the pixel that is included in the imaging section to a digital signal.

Thereby, a solid state imaging device with a built-in A/D conversion circuit can be realized with a simple constitution.

Effect of the Invention

According to the present invention, it is possible to constitute a clock generating circuit without providing a buffer circuit for supplying electrical power.

EMBODIMENTS FOR CARRYING OUT THE INVENTION

Hereinbelow, preferred embodiments of the present invention shall be described with reference to the figures. Note that the present invention is not limited to the following embodiments, and for example the constituent elements of these embodiments may be suitably combined.

First Embodiment

Hereinbelow, a first embodiment of the present invention shall be described. The A/D (analog/digital) conversion circuit in the present embodiment includes a clock generating circuit; a counter (counting section) and an encoder (data generating section) that measure the output signal from the clock generating circuit; a first latch circuit that holds the output signal from the counter; a second latch circuit that holds the output signal from the counter; a third latch circuit that adds the output signals from the first latch circuit and the second latch circuit and holds the sum, and a computing unit (digital data generating section) that computes the difference between the previous signal and the current signal using the third latch circuit and outputs it to an external subsequent stage circuit.

Figure 8:
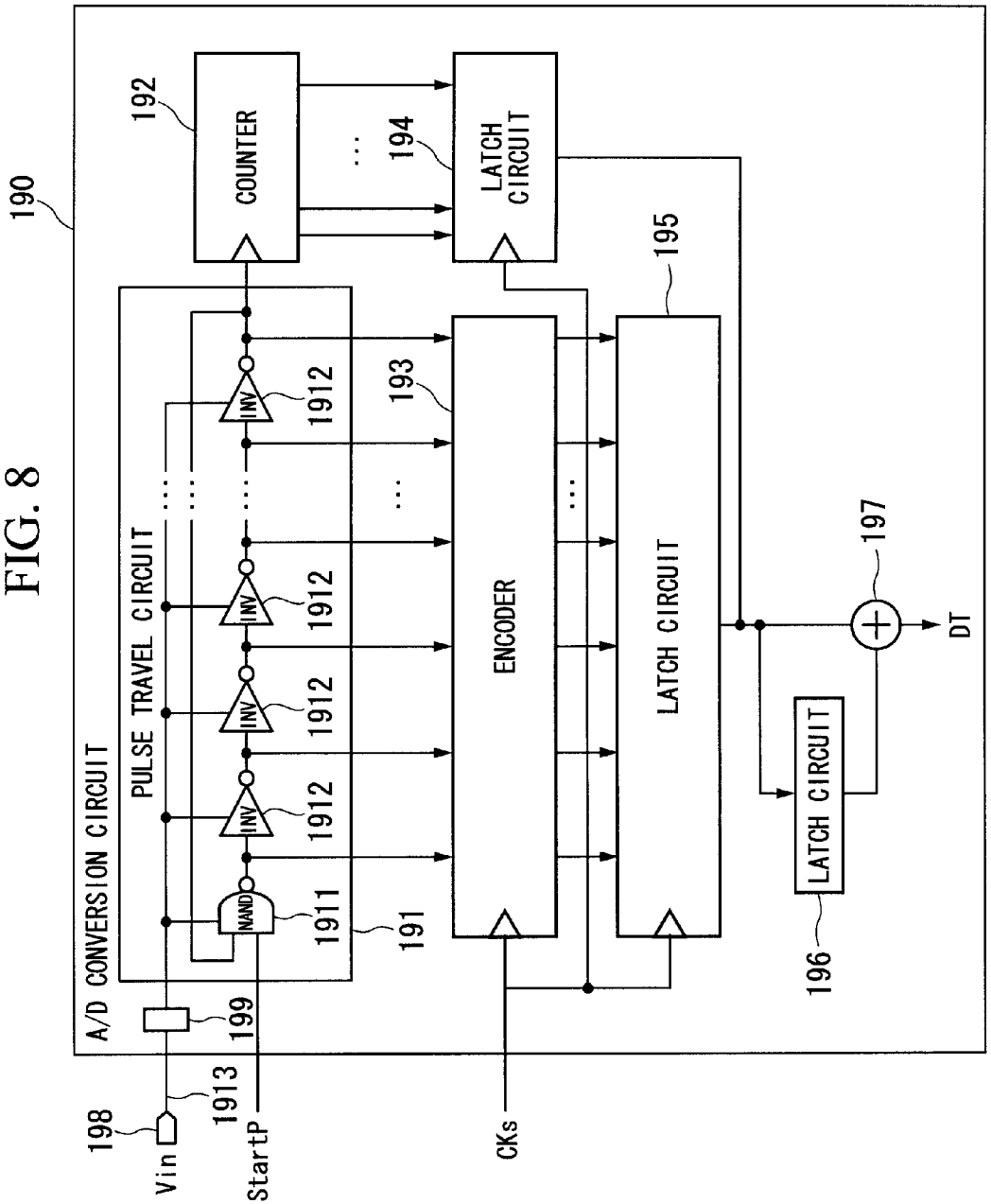
FIG. 8 is a configuration diagram that shows the configuration of a conventionally known A/D conversion circuit.
Figure 9:
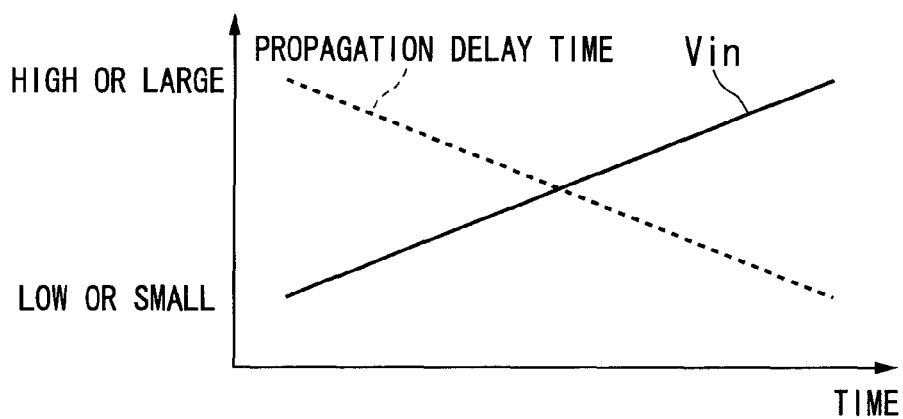
FIG. 9 is a diagram that shows the relation between the magnitude of the analog input signal in the A/D conversion circuit and the propagation delay time of the pulse signal that travels in the circuit.
Figure 10:
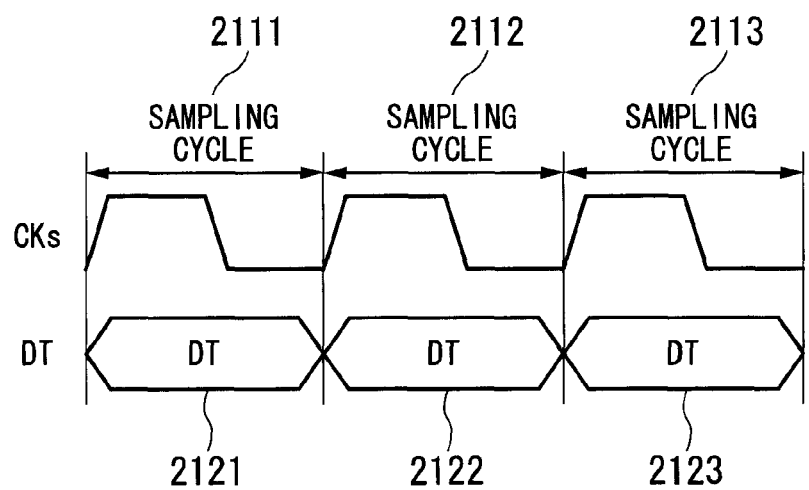
FIG. 10 is a diagram that shows the relation of the sampling cycle in the A/D conversion circuit and the timing of outputting digital data.

The A/D conversion circuit in the present embodiment differs from the A/D conversion circuit shown in FIG. 8 only by the constitution of the clock generating circuit, and sections other than the clock generating circuit have the same constitution as those sections shown in FIG. 8.

Figure 1:
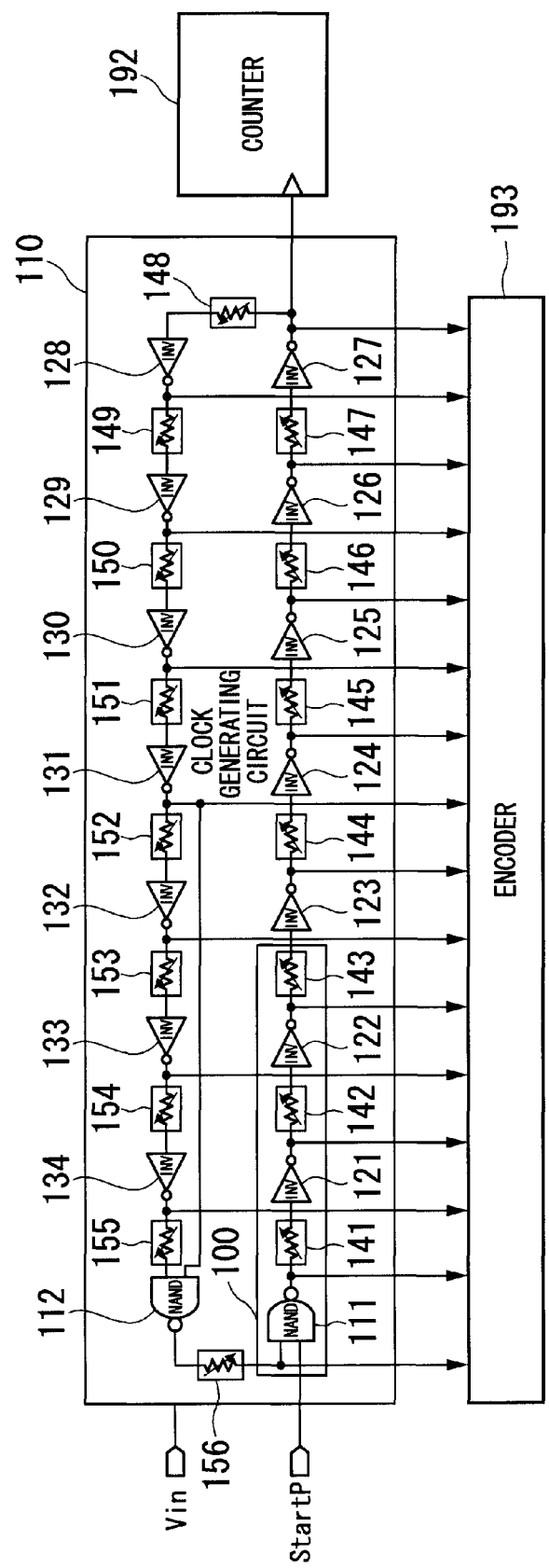
FIG. 1 is a circuit diagram that shows the circuit of a clock generating circuit in a first embodiment of the present invention.

FIG. 1 is a circuit diagram that shows the circuit of a clock generating circuit 110 in the present embodiment. The clock generating circuit 110 in the present embodiment includes negative AND (NAND) circuits, inverter (INV) circuits, and variable resistive elements (VR). In the clock generating circuit 110 of the illustrated example, NAND 111, INV 121 to 134, and NAND 112 are connected in that order. Also, the NAND 112 is connected to the NAND 111. Also, variable resistive elements VR 141 to 156 are connected between the adjacent NAND 111, INV 121 to 134, and NAND 112. In the variable resistive elements VR 141 to 156, the resistance value (impedance) changes in accordance with the analog signal Vin that is the object of the A/D conversion.

Also, the clock generating circuit 110 couples in a ring shape one NAND circuit (NAND 111) that is an inverting circuit for activation that operates upon receiving a pulse signal StartP to one input terminal, and 14 inverter circuits (INV 121 to 134) that operate as inverting circuits, and is constituted so that only the input terminal of the NAND 112 receives the output from the INV 131 as a feed forward loop. This is due to the output of each inverting circuit being made to oscillate in a cycle according to a delay time of each inverting circuit that is included in the clock generating circuit 110 while the pulse signal StartP is being input. Note that as the constitution of the feed forward loop, including the insertion position of the NAND 112, it is not necessary to be restricted to the aforementioned constitution.

Also, the outputs of the NANDs 111 and 112 and the INVs 121 to 134 are input to an encoder 193, and the output of the INV 127 is input to the counter 192. The operation of the counter 192 and the encoder 193 is the same as that of the counter 192 and the encoder 193 shown in FIG. 8.

Moreover, although not illustrated, the upside power supply terminal or downside power supply terminal of each inverting circuit that constitutes the clock generating circuit 110 of this embodiment is connected to a power supply that is common with a desired (constant) power supply.

Note that a constitution in which a resistive element other than a variable resistive element or a capacitive element is added between each inverting circuit is possible. A specific example will be explained in the second embodiment.

Figure 2:
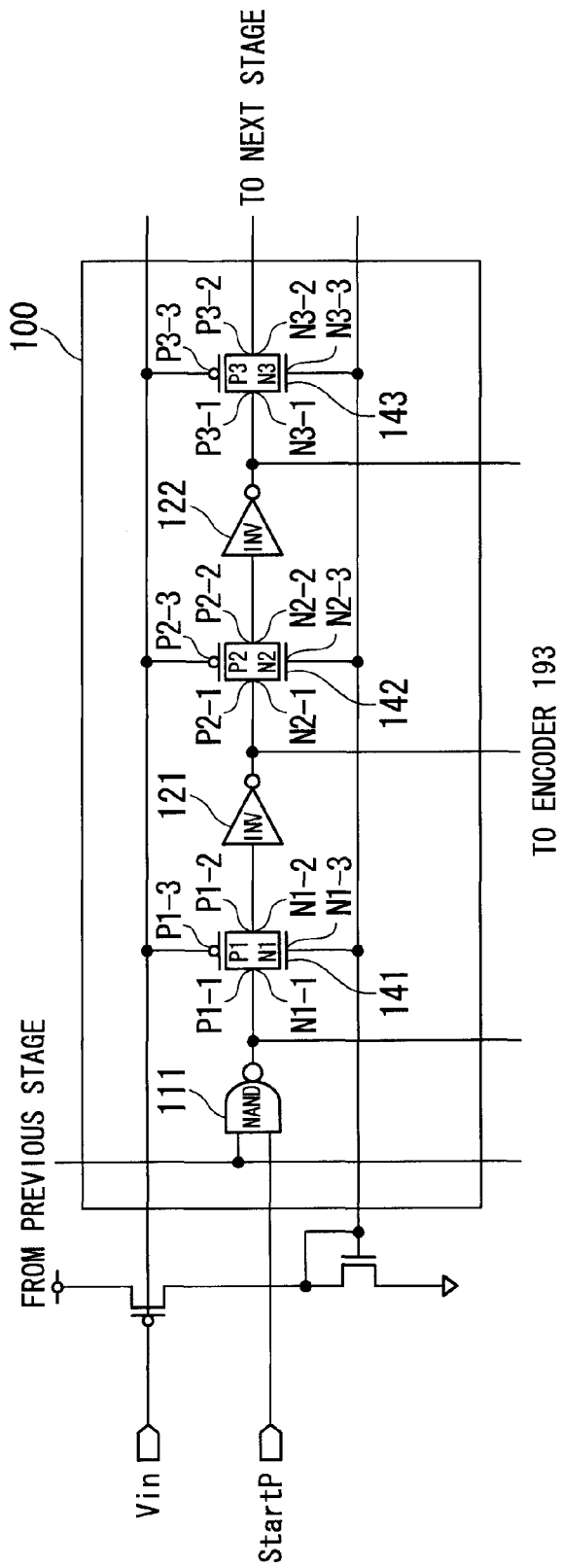
FIG. 2 is a partial magnified diagram that shows a section of the clock generating circuit in the first embodiment of the present invention.

FIG. 2 is a partial magnified diagram that shows a portion of the clock generating circuit 110 in the present embodiment (the portion denoted by reference symbol 100 in FIG. 1). The constitution of the entire clock generating circuit 110 in the present embodiment may be constituted as shown in FIG. 2.

In the example shown in FIG. 2, the variable resistive element VR 141 is a PMOS transistor and an NMOS transistor. The first terminal P1_1/N1_1 that the variable resistive element VR 141 is provided with is connected to the output terminal of the previous-stage inverting circuit (NAND 111). Also, the second terminal P2_1/N2_1 is connected to the input terminal of the subsequent-stage inverting circuit (INV 121). Also, the voltage according to the analog signal Vin which is the object of the A/D conversion is supplied to the control terminal P1_3/N1_3 that controls the current that flows between the first terminal P1_1/N1_1 and the second terminal P1_2/N1_2.

Moreover, each of the other variable resistive elements VR142 to VR156 as well is a PMOS transistor and an NMOS transistor, and is similarly connected to each inverting circuit.

Thereby, it is possible to realize a variable resistive element with a simple constitution. Although the variable resistive element in the illustrated example is constituted using a PMOS transistor and an NMOS transistor, it may be constituted with a single PMOS transistor, it may be constituted with a single NMOS transistor, it may be constituted with a single diffused resistor, and may be constituted with a combination.

By having the above-described constitution, a low-pass filter is formed by the variable resistive element and the subsequent-stage capacitance (for example, the input capacitance of an inverting circuit), and a clock with a frequency in accordance with that is outputted from the clock generating circuit 110. For that reason, it is possible to realize an A/D conversion circuit without providing in the clock generating circuit 110 a buffer circuit that supplies electrical power in accordance with the analog signal that is the object of the A/D conversion. Thereby, an A/D conversion circuit can be constituted from a simple circuit, the area of the circuit can be made small, and the electric power consumption can be reduced.

Note that with the configuration mentioned above, viewed from the input terminal of the analog input signal Vin, the input impedance of each inverting circuit becomes high impedance. For this reason, the signal value is not influenced despite the drive capacity of the analog input signal Vin. Therefore, the buffer circuit that was required in the conventional art is eliminated in the present embodiment.

Second Embodiment

Hereinbelow, a second embodiment of the present invention shall be described with reference to the figures. The A/D conversion circuit in the present embodiment differs from the A/D conversion circuit 190 shown in FIG. 8 only by the constitution of the clock generating circuit, and sections other than the clock generating circuit have the same constitution as those sections shown in FIG. 8.

Also, a difference between the present embodiment and the first embodiment is that a variable capacitative element is used in the present embodiment as the element with changing impedance that is included in the clock generating circuit.

Figure 3:
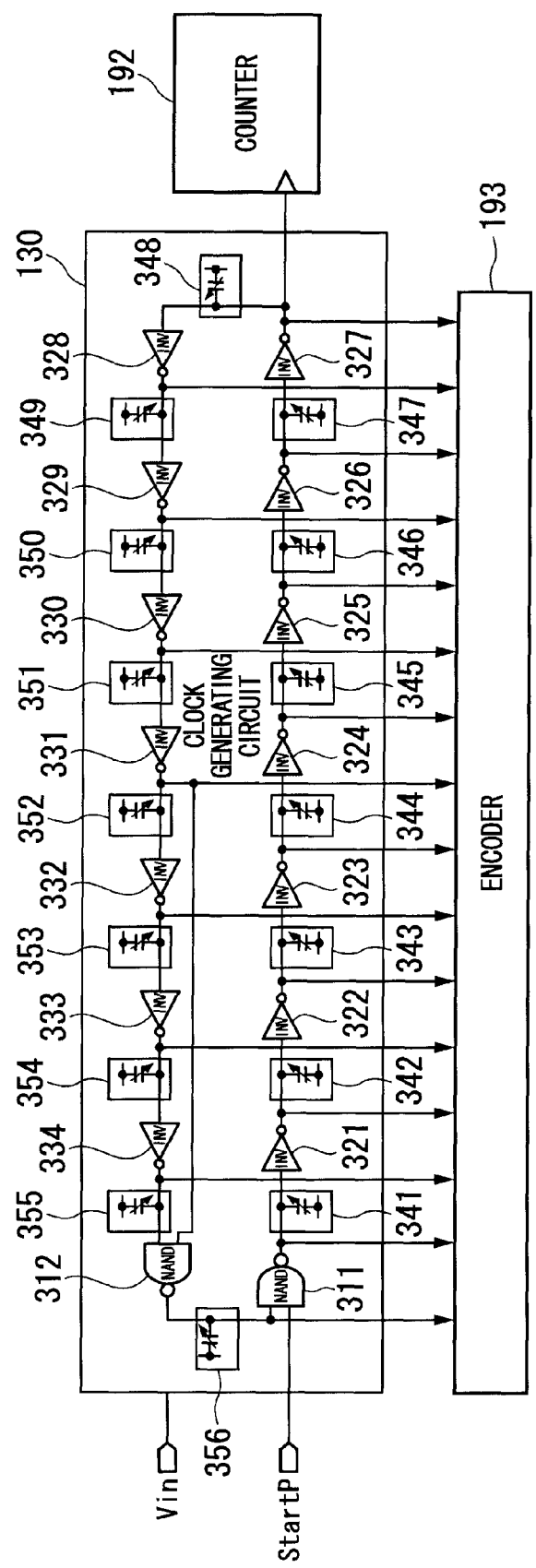
FIG. 3 is a circuit diagram that shows the circuit of a clock generating circuit in a second embodiment of the present invention.

FIG. 3 is a circuit diagram that shows the circuit of a clock generating circuit 130 in this embodiment. The clock generating circuit 130 in the present embodiment includes NAND circuits, inverter circuits, and variable capacitive elements (VC). In the clock generating circuit 13 of the illustrated example, NAND 311, INV 321 to 334, and NAND 312 are connected in that order. Also, the NAND 312 is connected to the NAND 311. Also, the variable capacitive elements VC 341 to 356 are connected between the adjacent NAND 311, INV 321 to 334, and NAND 312. In the variable capacitive elements VC 341 to 356, the capacitance value (impedance) changes in accordance with the analog signal Vin that is the object of the A/D conversion.

Also, the clock generating circuit 130 couples in a ring shape one NAND circuit (NAND 311) that is an inverting circuit for activation that operates upon receiving a pulse signal StartP to one input terminal, and 14 inverter circuits (INV 321 to 334) that operate as inverting circuits, and is constituted so that only the input terminal of the NAND 312 receives the output from the INV 331 as a feed forward loop. This is due to the output of each inverting circuit being made to oscillate in a cycle according to a delay time of each inverting circuit that is included in the clock generating circuit 130 while the pulse signal StartP is being input. Note that as the constitution of the feed forward loop, including the insertion position of the NAND 312, it is not necessary to be restricted to the aforementioned constitution.

Also, the outputs of the NANDs 311 and 312 and the INVs 321 to 334 are input to an encoder 193, and the output of the INV 327 is input to the counter 192. The operation of the counter 192 and the encoder 193 is similar to that of the counter 192 and the encoder 193 shown in FIG. 8.

In the present embodiment, a variable capacitive element (VC 341 to 346) whose capacitance value changes (impedance changes) in accordance with the analog signal Vin that is the object of the A/D conversion is provided between each inverting circuit. Moreover, although not illustrated, the upside power supply terminal or downside power supply terminal of each inverting circuit that constitutes the clock generating circuit 130 of this embodiment is connected to a power supply that is common with a desired (constant) power supply. Note that a constitution in which a resistive element or a capacitative element other than a variable capacitative element is added between each inverting circuit is possible.

By having the above-described constitution, a low-pass filter is formed by the previous stage resistance (for example, the output resistance of the inverting circuit) and the variable capacitative element, and a clock with a frequency in accordance with that is outputted from the clock generating circuit 130. For that reason, it is possible to realize an A/D conversion circuit without providing in the clock generating circuit 130 a buffer circuit that supplies electrical power in accordance with the analog signal that is the object of the A/D conversion. Thereby, an A/D conversion circuit can be constituted from a simple circuit, the area of the circuit can be made small, and the electric power consumption can be reduced.

Note that with the present embodiment, in the same manner as the first embodiment, viewed from the input terminal of the analog input signal Vin, the input impedance of each inverting circuit becomes high impedance. For this reason, the signal value is not influenced despite the drive capacity of the analog input signal Vin. Therefore, the buffer circuit that was required in the conventional art is eliminated in the present embodiment.

Third Embodiment

Figure 4:
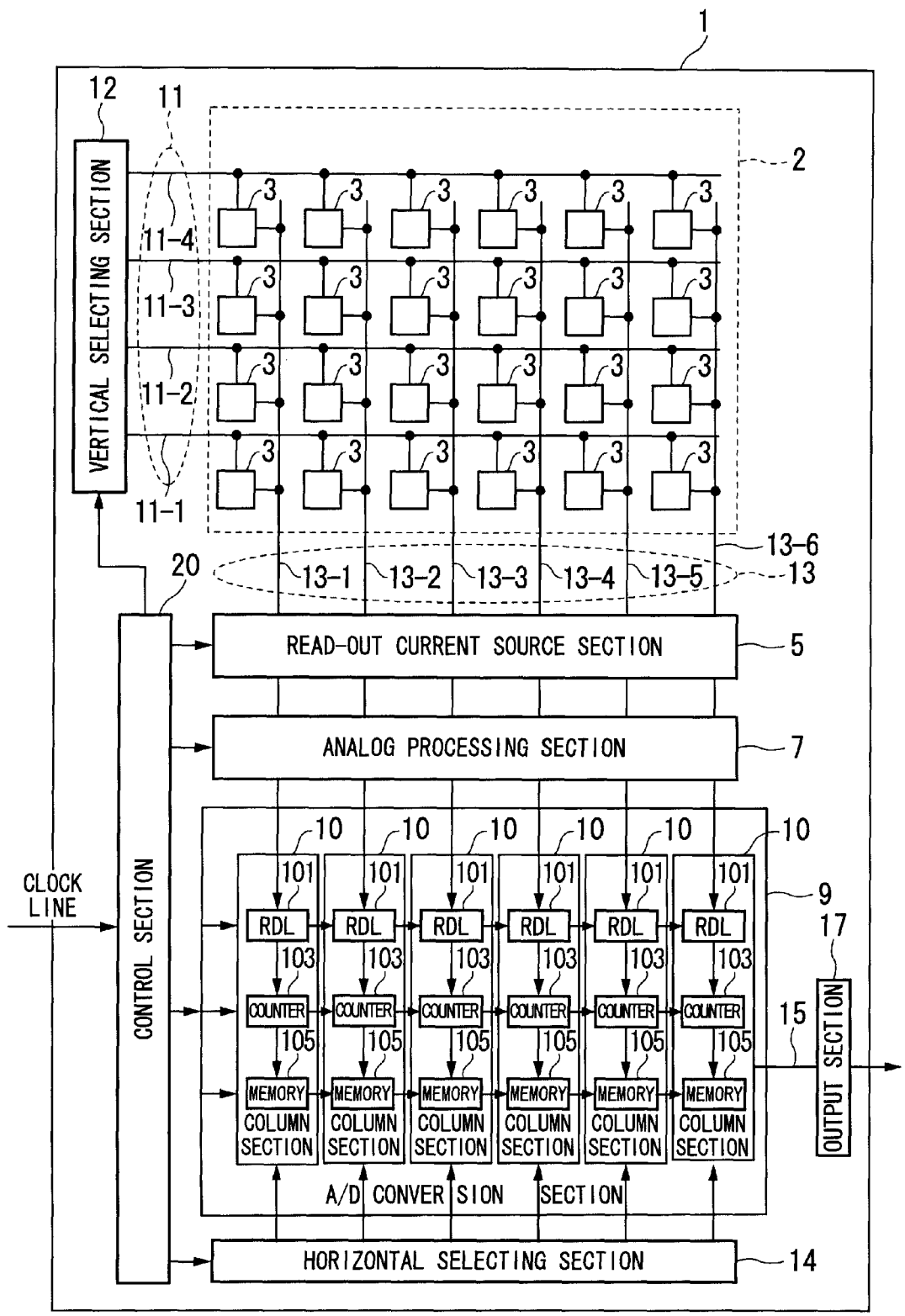
FIG. 4 is a configuration diagram that shows the configuration of a (C)MOS-type solid state imaging device in a third embodiment of the present invention.

Hereinbelow, a third embodiment of the present invention shall be described with reference to the figures. FIG. 4 is a configuration diagram that shows the configuration of a (C)MOS-type solid state imaging device in the present embodiment. In the example that is shown, a solid state imaging device 1 includes an imaging section 2 in which a plurality of unit pixels 3 are arranged in a matrix manner, each unit pixel 3 generating a signal in accordance with the magnitude of an incident electromagnetic wave, and outputting the generated signal. It also includes a vertical selecting section 12 for selecting each row of unit pixels 3 that are included in the imaging section 2. It also includes a read-out current source section 5 for reading out the signal that is output from the imaging section 2 as a voltage signal. Moreover, it further includes an analog processing section 7 for performing processing such as CDS (correlated double sampling) processing, clamp processing, etc. on the voltage signal that the read-out current source section 5 has read out. It also includes an A/D conversion section 9 that has column sections 10 for performing A/D conversion in accordance with the voltage signal processed by the analog processing section 7. Also, it includes a horizontal selecting section 14 for selecting and reading out the data that is stored in the column sections 10. It further includes an output section 17 that outputs the data that the horizontal selecting section 14 has read out. Also, it includes a control section 20 that performs control of each section of the solid state imaging device 1.

Note that the imaging section 2 that is shown in FIG. 4 shows an example that is constituted from four rows by six columns of unit pixels 3 for the sake of simplicity. However, in actuality, tens to thousands of unit pixels 3 are arranged in every row and every column of the imaging section 2. Furthermore, although not shown in the figure, the unit pixel 3 that constitutes the imaging section 2 is made of a photoelectric transducer such as a photo diode/photo gate/photo-transistor, and a transistor circuit.

The unit pixels 3 are connected to the vertical selecting section 12 via vertical control lines 11 (11_1 to 4) for line selection. Also, the signals that are output from the unit pixels 3 are connected to the read-out current source section 5 and the analog processing section 7 via vertical signal lines 13 (13_1 to 6).

Figure 5:
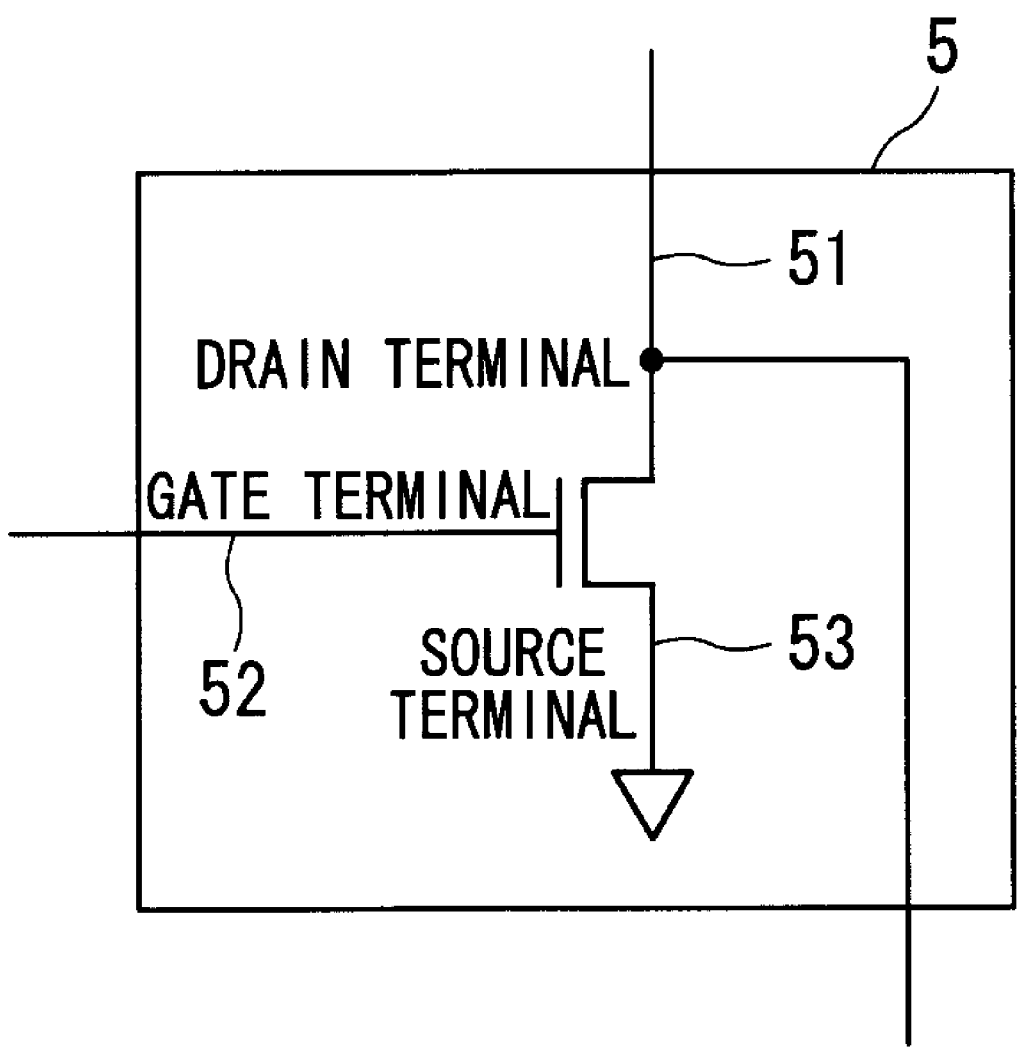
FIG. 5 is a circuit diagram that shows an example of the circuit of a read-out current source section in the third embodiment of the present invention.

FIG. 5 is a circuit diagram that shows an example of the circuit of the read-out current source section 5 in the present embodiment. In the example that is illustrated, the read-out current source section 5 is constituted using an NMOS transistor. The constitution is such that the vertical signal line 13 from the imaging section 2 is connected to a drain terminal 51, a desired voltage is appropriately impressed on a control terminal 52 (gate terminal), and a source terminal 53 is connected to GND (ground). Thereby, a signal from the pixel 3 is output as a voltage mode. Note that in the illustrated example, the case is described of using an NMOS transistor as the read-out current source section 5. However, it is not necessarily limited to this.

The column section 10 that is shown in FIG. 4 includes an RDL 101 (ring delay line), a counter 103, and a memory 105. The RDL 101 is a clock generating section that provides between each inverting circuit a variable resistive element whose resistance value changes according to the signal Vin from the imaging section 2 via the analog processing section 7. The counter 103 performs count processing of the count pulses that are output from the RDL 101. The memory 105 holds the value that the counter 103 has counted.

Figure 6:
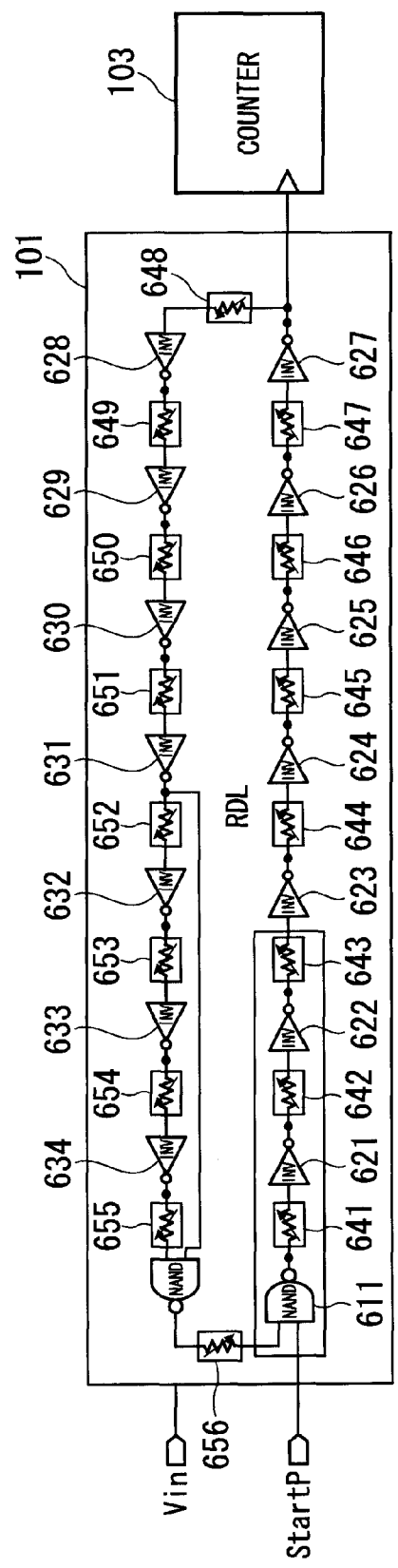
FIG. 6 is a circuit diagram that shows an example of the circuit of an RDL in the third embodiment of the present invention.

FIG. 6 is a circuit diagram that shows an example of the circuit of the RDL 101, which is a clock generating section. In the illustrated example, it is constituted so that one NAND circuit (NAND 641) that is an inverting circuit for activation that starts operation upon receiving a start signal StartP to one input terminal, and a plurality of inverter circuits (INV 621 to 634) that are inverting circuits are connected in a ring shape, and the output from the INV 631 is inputted to either input 1 or input 2 of the NAND 612 as a feed forward loop.

Note that the constitution of the feed forward loop, including the insertion position of the NAND 612, is not necessary restricted to this, and the clock from the RDL 101 to the subsequent-stage counter 103 is not necessarily restricted to the output from the INV 627.

As a characteristic of the present embodiment, a variable resistive element (VR 641 to 656) in which the resistance value changes in accordance with the signal Vin from the imaging section 2 via the analog processing section 7 that becomes the object of the A/D conversion is provided between each inverting circuit.

Note that, although not illustrated, the upside power supply terminal or downside power supply terminal of each inverting circuit that constitutes the RDL 101 of FIG. 6 is connected to a power supply that is common with a desired (constant) power supply. Also, it does not matter if a constitution is made that separately adds a resistive element or a capacitative element other than a variable resistive element between each inverting circuit. Moreover, it does not matter if a detecting means that detects each output signal of the plurality of inverting circuits that constitute the RDL 101 and a memory means that holds that value are built into the column section 10.

Moreover, although it is desirable to use an asynchronous-type counter circuit, which is easy to control, as the counter 103, a synchronous-type counter circuit may also be used. Note that since the pixel signal that is output from the imaging section 2 is expressed by a reference level such as a reset level and an actual signal level that is overlapped on the reset level, it is necessary to perform difference processing between the reset level and the signal level in order to extract the actual signal level.

It is possible to easily carry out this difference processing by using an up/down counter that has an up-count mode and a down-count mode as a count circuit that constitutes the counter 103. For example, the count process may be performed with an up-count mode when reading out the reset level, and a down-count mode when reading out the signal level. Alternatively, the count processing may be performed with a down-count mode when reading out the reset level and an up-count mode when reading out the signal level. Also, since there is not necessarily a need to carry out the difference processing by the counter 103, the counter circuit that constitutes the counter 103 is not necessarily restricted to an up/down counter.

Figure 7:
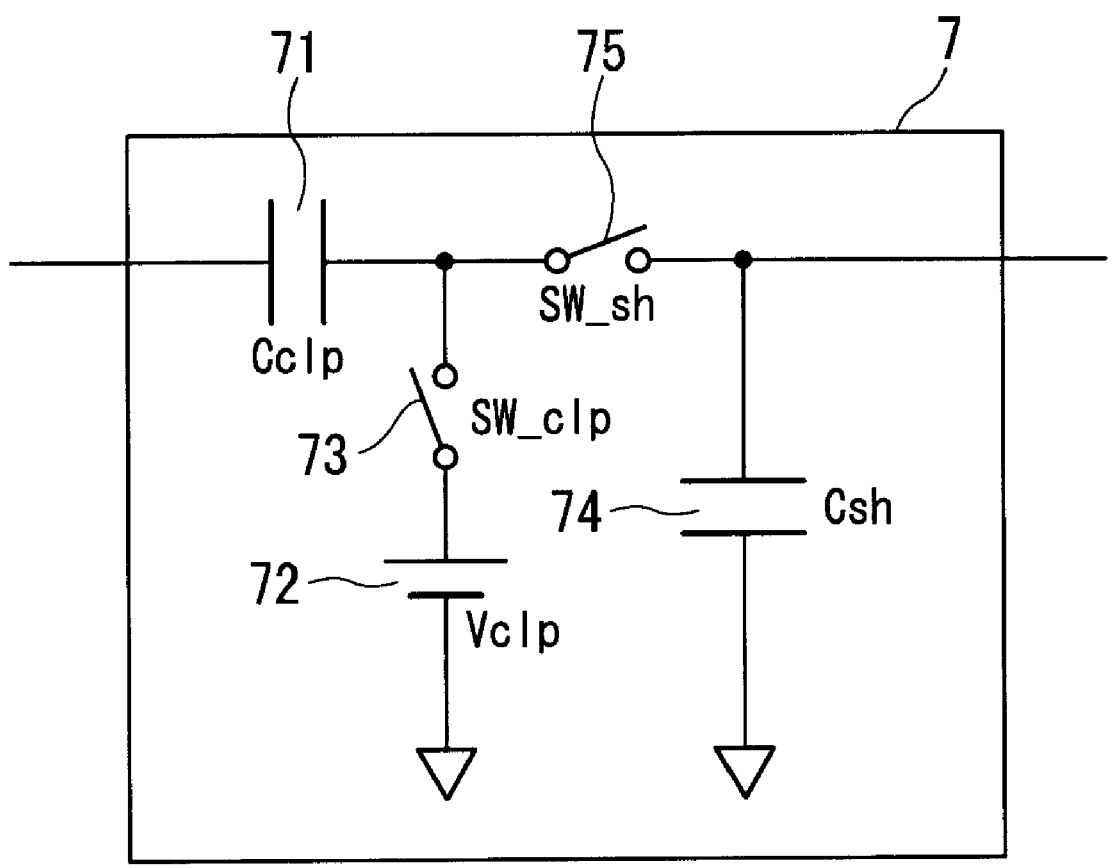
FIG. 7 is a circuit diagram that shows an example of the analog processing section in the third embodiment of the present embodiment.

FIG. 7 is a circuit diagram that shows an example of the analog processing section 7 in the present embodiment. In the illustrated example, the analog processing section 7 is constituted so as to have a CDS processing function as a noise removing means. The analog processing section 7 includes a clamp capacitor 71 (Cclp) that is connected to the vertical signal line 13, a clamp switch 73 (SW_clp) for clamping the clamp capacitor 71 to a clamp bias 72 (Vclp), a sample hold capacitor (Csh) for sample-holding the signal, and a sample hold switch 75 (SW_sh).

In the case of performing CDS processing, the analog processing section 7 performs difference processing, for a pixel signal in voltage mode that has been input via the vertical signal line 13, between a signal level immediately after the pixel reset (reset level) and an actual signal level, based on two pulses: a clamp pulse (CLP) and a sample pulse (SH) that are provided from the control section 20. Thereby, a FPN (Fixed Pattern Noise), which is a fixed variation for each pixel, and a noise component called a reset noise are removed. In addition to the CDS processing function, the analog processing section 7 may further include a PGA (Programmable Gain Amplifier) circuit with a function of amplifying a signal, and other processing functions, as required.

The vertical selecting section 12 and the horizontal selecting section 14 are designed to execute a selection operation in response to a drive pulse provided from the control section 20. Note that, in each of the vertical control lines 11_1 to 4, a variety of pulse signals for driving the unit pixels 3 are included. Furthermore, although not shown in the figure, the vertical selecting section 12 is made of a vertical shift register or decoder for performing a basic control of the row from which a signal is read. The vertical selecting section 12 may have a shift register or a decoder which performs a row control for an electronic shutter. Similarly, the horizontal selecting section 14 has a horizontal shift register or decoder, and has a function of a selecting means that selects, in a predetermined order, pieces of data stored in the column circuits 10 constituting the A/D conversion section 9, and outputs the selected pieces of pixel information to a horizontal signal line 15.

Also, although not shown in the figure, the control section 20 has a TG (Timing Generator) functional block that supplies clock pulses required for the operation of every section and pulse signals at predetermined timings, and a functional block that communicates with the TG. Note that the control section 20 may be configured as a separate semiconductor integrated circuit independent of other functional elements such as the imaging section 2, the vertical selecting section 12, and the horizontal selecting section 14. In this case, an imaging device as one example of a semiconductor system is constructed by an imaging device made of the imaging section 2, the vertical selecting section 12, the horizontal selecting section 14, and the like; and the control section 20. This imaging device may be configured as an imaging module into which peripheral signal processing and power source circuits and the like are incorporated.

The output section 17 amplifies, with an appropriate gain, the pixel signals of the unit pixels 3 that is output from the imaging section 2 via the horizontal signal line 15, and then outputs them as image pickup signals to an external circuit. The output section 17 may only perform buffering, or may have built in, for example, a signal processing function which performs black level adjustment, column variation correction, color processing, or the like before buffering. Furthermore, the output section 17 may be configured so as to convert n-bit parallel digital data to serial data and output it. In this case, for example a multiplier circuit such as a PLL (Phase Locked Loop) may be built into the solid-state imaging device 1.

As described above, since there is no need to provide in the clock generating section a buffer circuit that supplies electrical power in accordance with the signal from the imaging section that is the object of A/D conversion, a solid state imaging device can be realized with a simple constitution.

While embodiments of the present invention have been described above in detail with reference to the figures, the specific configuration thereof is not limited to these embodiments. Designs and the like that do not depart from the scope of this invention are also included.

INDUSTRIAL APPLICABILITY

The present invention is suited for use in an A/D conversion circuit that converts analog signals to digital signals and a solid state imaging device that includes an A/D conversion circuit.

REFERENCE SYMBOLS

1 Solid state imaging device
2 Imaging section
3 Unit pixel
5 Read-out current source section
7 Analog processing section
9 A/D conversion section
10 Column section
11 Vertical control line
12 Vertical selecting section
13 Vertical signal line
14 Horizontal selecting section
15 Horizontal signal line
17 Output section
20 Control section
51 Drain terminal
52 Gate terminal
53 Source terminal
71 Clamp capacitor 72 Clamp bias
73 Clamp switch
74 Sample hold capacitor
75 Sample hold switch
101 RDL
103, 192 Counter
105 Memory
110, 130, 191 Clock generating circuit
111, 112, 311, 312, 611, 612 NAND
121 to 134, 321 to 334, 621 to 634 Inverter
141 to 156, 341 to 356, 641 to 656 Variable resistive element
190 A/D conversion circuit
193 Encoder
194 to 196 Latch circuit
197 Computing unit
199 Buffer circuit
1911 NAND
1912 Inverter circuit

The invention claimed is:

1. An A/D conversion circuit comprising:
a clock generating circuit in which a plurality of stages of inverting circuits are connected, a start signal that causes start of clock generation and an output signal from the inverting circuit of a predetermined stage are input to one of the inverting circuits, an element having impedance that changes in accordance with a magnitude of an object analog signal that is an object of conversion to a digital signal is provided between the adjacent inverting circuits, and which generates a clock of a frequency in accordance with the magnitude of the object analog signal; and
a counting section that counts the number of clocks generated by the clock generating circuit and outputs a count value.

2. The A/D conversion circuit according to claim 1, wherein the element is a resistive element.

3. The A/D conversion circuit according to claim 1, wherein the element is a capacitative element.

4. The A/D conversion circuit according to claim 2, wherein the resistive element is a MOS transistor that has three terminals, the first terminal being connected to an output terminal of the inverting circuit of a previous stage, the second terminal being connected to the inverting circuit of a subsequent stage, and the target analog signal being supplied to a control terminal that controls current that flows between the first terminal and the second terminal.

5. The A/D conversion circuit according to any one of claims 1 to 4, further comprising:
a data generating section that generates data based on an output signal that each of the plurality of inverting circuits that are included in the clock generating circuit outputs; and
a digital data generating section that generates digital data in accordance with the magnitude of the object analog signal, based on the data that is generated by the data generating section and the count value that is output by the counting section.

6. A solid state imaging device comprising:
an imaging section in which are arranged in a matrix a plurality of pixels that output a pixel signal in accordance with a magnitude of an incident electromagnetic wave; and
the A/D conversion circuit according to claim 1 that converts the pixel signal that is output by the pixel that is included in the imaging section to a digital signal.

7. A solid state imaging device comprising:
an imaging section in which are arranged in a matrix a plurality of pixels that output a pixel signal in accordance with a magnitude of an incident electromagnetic wave; and
the A/D conversion circuit according to claim 2 that converts the pixel signal that is output by the pixel that is included in the imaging section to a digital signal.

8. A solid state imaging device comprising:
an imaging section in which are arranged in a matrix a plurality of pixels that output a pixel signal in accordance with a magnitude of an incident electromagnetic wave; and
the A/D conversion circuit according to claim 3 that converts the pixel signal that is output by the pixel that is included in the imaging section to a digital signal.

9. A solid state imaging device comprising:
an imaging section in which are arranged in a matrix a plurality of pixels that output a pixel signal in accordance with a magnitude of an incident electromagnetic wave; and
the A/D conversion circuit according to claim 4 that converts the pixel signal that is output by the pixel that is included in the imaging section to a digital signal.

10. A solid state imaging device comprising:
an imaging section in which are arranged in a matrix a plurality of pixels that output a pixel signal in accordance with a magnitude of an incident electromagnetic wave; and
the A/D conversion circuit according to claim 5 that converts the pixel signal that is output by the pixel that is included in the imaging section to a digital signal.

* * * * *